(12) United States Patent
Tysoe et al.

(10) Patent No.: US 7,527,742 B2
(45) Date of Patent: May 5, 2009

(54) ETCHANT, METHOD OF ETCHING, LAMINATE FORMED THEREBY, AND DEVICE

(75) Inventors: Steven Alfred Tysoe, Ballston Spa, NY (US); Steven Francis LeBoeuf, Schenectady, NY (US); Mark Philip D'Evelyn, Niskayuna, NY (US); Venkat Subramaniam Venkataramani, Clifton Park, NY (US); Vinayak Tilak, Schenectady, NY (US); Jeffrey Bernard Fortin, Niskayuna, NY (US); Charles Adrian Becker, Niskayuna, NY (US); Stephen Daley Arthur, Glenville, NY (US); Samhita Dasgupta, Niskayuna, NY (US); Kanakasabapathi Subramanian, Clifton Park, NY (US); Robert John Wojnarowski, Ballston Lake, NY (US); Abasifreke Udo Ebong, Marietta, GA (US)

(73) Assignee: Momentive Performance Materials Inc., Albany, NY (US)

( * ) Notice: Subject to any disclaimer, the term of this patent is extended or adjusted under 35 U.S.C. 154(b) by 149 days.

(21) Appl. No.: 11/167,719

(22) Filed: Jun. 27, 2005

(65) Prior Publication Data

US 2006/0289386 A1    Dec. 28, 2006

(51) Int. Cl.
*C03C 15/00* (2006.01)
*C03C 25/68* (2006.01)
(52) U.S. Cl. ........................................ 216/83; 252/79.1
(58) Field of Classification Search .................... 216/83, 216/102; 252/79.1
See application file for complete search history.

(56) References Cited

U.S. PATENT DOCUMENTS

| 5,770,887 | A | 6/1998 | Tadatomo et al. |
| 6,413,627 | B1 | 7/2002 | Motoki et al. |

(Continued)

FOREIGN PATENT DOCUMENTS

JP    11045892 A  *  2/1999

OTHER PUBLICATIONS

Irene Dris, "As the Bluray Disk Turns . . . On the Road to Translation and Commercialization", 2002 Project Review, Nov. 1, 2002.

(Continued)

*Primary Examiner*—Roberts P Culbert
(74) *Attorney, Agent, or Firm*—Joseph E. Waters

(57) ABSTRACT

An etchant including a halogenated salt, such as Cryolite ($Na_3AlF_6$) or potassium tetrafluoro borate ($KBF_4$), is provided. The salt may be present in the etchant in an amount sufficient to etch a substrate and may have a melt temperature of greater than about 200 degrees Celsius. A method of wet etching may include contacting an etchant to at least one surface of a support layer of a multi-layer laminate, wherein the support layer may include aluminum oxide; or contacting an etchant to at least one surface of a support layer of a multi-layer laminate, wherein the etchant may include Cryolite ($Na_3AlF_6$), potassium tetrafluoro borate ($KBF_4$), or both; and etching at least a portion of the support layer. The method may provide a laminate produced by growing a crystal onto an aluminum oxide support layer, and chemically removing at least a portion of the support layer by wet etch. An electronic device, optical device or combined device including the laminate is provided.

36 Claims, 3 Drawing Sheets

U.S. PATENT DOCUMENTS

| | | | |
|---|---|---|---|
| 6,488,767 B1 | 12/2002 | Xu et al. | |
| 6,635,184 B1 * | 10/2003 | Cohen et al. | 216/22 |
| 7,181,972 B2 * | 2/2007 | Dasgupta et al. | 73/705 |
| 2004/0031978 A1 * | 2/2004 | D'Evelyn et al. | 257/233 |
| 2005/0059229 A1 | 3/2005 | Minemoto et al. | |

OTHER PUBLICATIONS

Brian Bircumshaw, "Microfabrication Primer", pp. 1-12, Apr. 14, 2000.

http://mineral.galleries.com/minerals/halides/cryolite/cryolite.htm, "The Mineral Cryolite", Cryolite (Sodium Aluminum Fluoride, 2 pages, 1996.

* cited by examiner

ETCHANT, METHOD OF ETCHING, LAMINATE FORMED THEREBY, AND DEVICE

BACKGROUND

The invention includes embodiments that relate to an etchant, and to a method of etching. The invention includes embodiments that relate to a laminate formed by etching, and to a device incorporating the laminate.

Semiconductor crystals, and the like, may be grown on foreign substrates or support layers to form a laminate. A support layer may include, for example, sapphire (aluminum oxide), which may be used because of inherent physical and chemical properties of the aluminum oxide. Some end-use applications may require the removal of part, or all, of the support layer after the semiconductor layer is formed. The removal of the support layer from the laminate may be advantageous to the formation of microelectromechanical (MEMS) devices, semiconductor devices such as integrated circuits, and the like. However, the removal process may be problematic in that the semiconductor layer may be damaged, or the removal process itself may be undesirable.

Support layers may be removed by, for example, etching, laser ablation, or by mechanical means. Some materials may etch differently than others based on material type, type of etchant, process parameters, and the like. For example, polycrystalline aluminum oxide or amorphous aluminum oxide may have an increased surface area and decreased chemical bonding strengths relative to single crystal or quasi-single crystal aluminum oxide (sapphire).

Etchants and their methods of use may produce differences in the resulting freestanding or etched laminates. These structural, chemical and/or physical differences may affect one or more of electrical properties, optical properties, physical properties, and the like, and further may affect the response of the etched laminate in subsequent processing steps. Dry Etch is a process that may result in a selective removal of material from a substrate by using a gas or plasma. There are at least three commercially viable dry etching processes, each of which may be less economically advantageous relative to wet etching. Hydrogen fluoride (HF) may be used in chemical vapor phase etching, and xenon fluoride ($XeF_2$) may be used to create isotropic etches. Sputtering may etch a surface by bombardment with ions. Wet Etch differs from dry etching in that it may use a liquid and/or chemical action to remove material with minimal, if any, physical etching Some support layers or oxide layers may be more difficult to remove than others may. For instance, silicon oxide may be removed easily at a relatively low temperature. But, for example, aluminum oxide, having a relatively increased chemical stability, heat resistance and rigidity, may be more difficult to remove or may require harsher removal methods. Increased chemical stability may increase the difficulty of removal by a wet etch method. Further, removing material from polycrystalline materials may be easier relative to single crystals and quasi-single crystals. The increased strain at a grain boundary interface in polycrystalline materials, for example, may make the materials relatively more susceptible to chemical attack, particularly at the interface. Accordingly, etchants useful for polycrystalline materials sometimes may not be useful as etchants for single crystals and quasi-single crystals of the same or similar chemical composition.

Increased rigidity for crystals may make dicing and/or grinding of those crystals relatively more problematic. Dicing forcibly pushes a blade through a laminate between layers. Grinding physically abrades the surface. Increases in broken and damaged laminates may result as increasingly rigid laminates are used.

With the removal of some or all of a support layer, the freestanding semiconductor layer may be used in optoelectronic devices such as light emitting diodes and lasers. Such devices using freestanding gallium nitride semiconductor layers may emit blue light and UV laser, possibly enabling a relatively higher storage density in magneto-optic memories and CD-ROM's and the construction of full color light emitting displays.

It may be desirable to have one or more of an etchant, a method for using the etchant, an etched laminate or a freestanding crystal, and a device containing the etched laminate or the freestanding crystal.

BRIEF DESCRIPTION

The invention includes embodiments that relate to a wet etchant for use in a wet chemical etching process of a chemically resistant crystalline material. The etchant may include a halogenated salt present in an amount sufficient to etch a substrate. The substrate may include at least one of single crystal aluminum oxide or quasi-single crystal aluminum oxide. The halogenated salt may form a flux at a melt temperature in a range of greater than about 200 degrees Celsius. In one embodiment, the salt may include one or both of Cryolite ($Na_3AlF_6$) and potassium tetrafluoro borate ($KBF_4$).

The invention includes embodiments that relate to one or more methods of wet etching. The method may include contacting an etchant to at least one surface of a support layer of a multi-layer laminate, wherein the support layer may include aluminum oxide; and, etching at least a portion of the support layer.

The method may include contacting an etchant to at least one surface of a support layer of a multi-layer laminate, wherein the etchant may include Cryolite ($Na_3AlF_6$), potassium tetrafluoro borate ($KBF_4$), or both; and, etching at least a portion of the support layer.

The invention includes embodiments that relate to an etched or freestanding laminate. The laminate may be a single layer or a multi-layer laminate, and may be produced by growing a single crystal or a quasi single crystal directly onto an aluminum oxide support layer, or onto an intermediate layer disposed between the support layer and the single crystal or quasi single crystal. At least a portion of the support layer may be chemically removed by wet etch.

In addition, the invention includes embodiments that relate to one or more electronic device, optical device, or combined device, which may include the freestanding or etched laminate. In one embodiment, the device may include a pressure sensor. In another embodiment, the device may include a wave guide.

DETAILED DESCRIPTION

Figure 1:
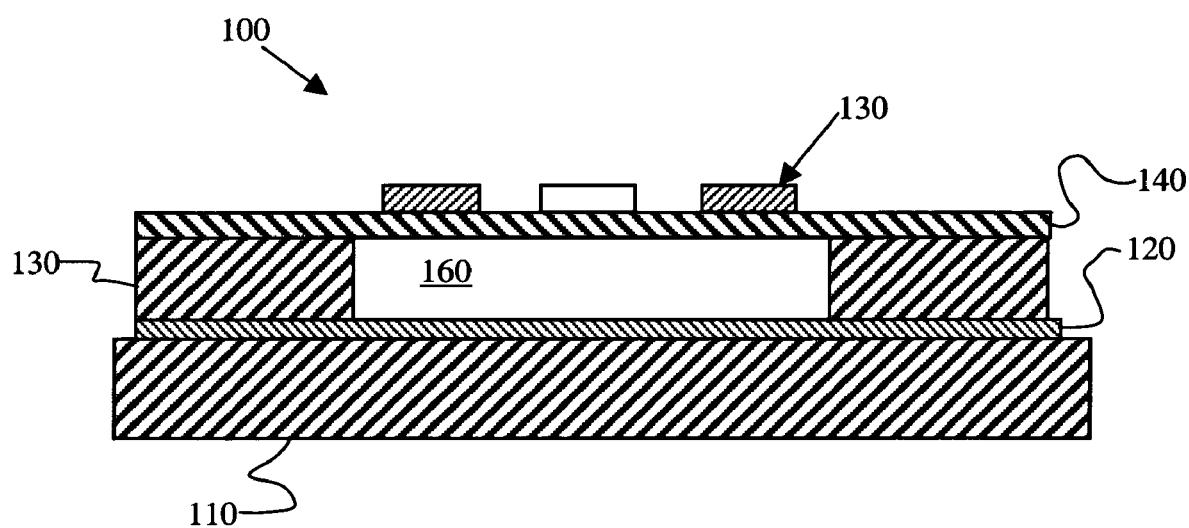
FIG. 1 is a cross-sectional side view of a pressure sensor comprising an embodiment of the invention.

The invention includes embodiments that relate to an etchant, and to a method of etching. The invention includes embodiments that relate to a laminate formed by etching, and to a device incorporating the laminate. The laminate may be an etched or freestanding laminate composed of a single crystal or a quasi-single crystal.

Approximating language, as used herein throughout the specification and claims, may be applied to modify any quantitative representation that could permissibly vary without resulting in a change in the basic function to which it is related. Accordingly, a value modified by a term or terms, such as "about", may be not to be limited to the precise value specified, and may include values that differ from the specified value. In at least some instances, the approximating language may correspond to the precision of an instrument for measuring the value. Similarly, "free" may be used in combination with a term, and may include insubstantial or trace amounts while still being considered free of the modified term. For example, free of gallium or aluminum metal may allow for less than about 5 ppm of metal.

A suitable etchant according to embodiments of the invention may include a halogenated salt. Suitable halogenated salts may include fluorine-containing salts, such as Cryolite ($Na_3AlF_6$), potassium tetrafluoro borate ($KBF_4$), or both Cryolite ($Na_3AlF_6$) and potassium tetrafluoro borate ($KBF_4$). In one embodiment, an etchant may include a halogenated salt of one or more of a Group I metal (alkali earth), a Group III metal or metalloid, or both.

Optionally, one or more additives may be included in an etchant to control or affect the properties and/or function of the etchant. Suitable additives may include, but are not limited to, one or more of a reaction inhibiting or accelerating material (e.g., a non-reactive diluent salt or a reactive halogenated material), a dopant or dopant precursor, and the like.

A suitable dopant or dopant precursor (collectively "dopant") may include one or more metal or metalloid. Suitable metals or metalloids may include one or more of alkali metals, alkali earth metals, transition metals, and the like. In one embodiment, one or more of arsenic, antimony, boron, lithium, magnesium, phosphorus, potassium, rubidium, sodium, and the like may be diffused into a layer of the multi-layer structure. In one embodiment, a magnesium-based dopant may be formed from magnesium fluoride or magnesium oxide.

A dopant may be added to the etchant prior to or during the etching process to diffuse into one or more of the laminate layers. In one embodiment, dopant diffusion may occur over a predetermined time so that the dopant atoms may be distributed uniformly into an exposed surface to a predetermined depth and at a concentration that can be controlled. A suitable diffusion time may be, e.g., from about 0.5 hours to about 1 hour, from about 1 hour to about 5 hours, from about 5 hours to about 10 hours, or greater than about 10 hours. A suitable dopant atom distribution depth into an exposed surface may be, e.g., from less than about 0.5 micrometers, from about 0.5 micrometers to about 1 micrometer, from about 1 micrometer to about 5 micrometers, or greater than about 5 micrometers. A suitable dopant atom concentration that may be, e.g., less than about 1000 $cm^{-3}$, from about 1000 $cm^{-3}$ to about $10^{10}$ $cm^{-3}$, from about $10^{10}$ $cm^{-3}$ to about $10^{20}$ $cm^{-3}$, or greater than about $10^{20}$ $cm^{-3}$. Here and throughout the specification and claims, range limitations may be combined and/or interchanged, such ranges are identified and include all the sub-ranges contained therein unless context or language indicates otherwise.

In one embodiment, a method of etching may include contacting a liquid etchant to at least one surface of an aluminum oxide layer of a multi-layer laminate. In response to the contact, at least a portion of the aluminum oxide layer may be removed. The etched areas may be determined by the use of a mask or protective layer that restricts the contact area of the etchant. The mask may be formed onto, or overlaid onto, at least a portion of an exposed surface of the substrate. The mask may define one or more protected surface areas and one or more exposed surface areas. By controlling the pattern of the protected surface areas relative to the exposed surface areas, removal of material from pre-defined areas may be obtained. Pre-defined area etching may be used to form one or more contact openings in, for example, a dielectric layer (e.g. to connect a metal layer to a semiconductor layer through a dielectric or insulative layer).

Naturally, the method may be extended to remove more than just a defined portion of the substrate, that is, the entire substrate may be removed to leave a freestanding laminate, which may have a single layer (for an initially two layer laminate) or more (for an initially three or more layer laminate). Alternatively, material may be removed without a mask to achieve a predetermined thickness of residual substrate.

Additionally or alternatively to the use of a mask, the bare laminate surface may be affixed to another material, perhaps through wafer bonding, whereby only the substrate may be exposed to the etchant at process temperatures. In one embodiment, heat isolation may enable removal of the substrate from temperature sensitive and/or easily etched materials, such as an InGaN-based LED heterostructure. In one embodiment, a central portion of a substrate of a multi-layer laminate may be removed using a mask, o-ring or seal. The surrounding or peripheral portion of the substrate may be maintained relatively untouched to provide mechanical support to the laminate. The resulting partially supported-membrane device may have piezoelectric properties, and may be useful, for example, as a pressure sensor, transducer, microphone, or an acoustic generator, and the like.

A method may include etching a first portion of the oxide layer at an etching rate that is greater than about an etching rate of second portion of the oxide layer. Similarly, a portion of the oxide layer may be etched at an etching rate that differs from an etching rate of a different layer of the multi-layer laminate. For example, a suitable multi-layer laminate may include a gallium nitride (GaN) layer supported on a single crystal (SC) sapphire substrate or support layer, and the etchant may remove the sapphire layer at a rate greater than the removal rate of the gallium nitride layer.

Suitable substrates removable by the etchant may include aluminum oxide. In one embodiment, an aluminum oxide may include one or more of sapphire, emerald, or ruby, and may be single crystal. Other suitable materials for use in the substrate may include carbide, nitride or both. A suitable substrate may be formed by the Czochralski method.

In addition to the above-disclosed substrate or support layer, a multi-layer laminate includes at least one other layer. This second layer may include one or more of a semiconductor material, or a film formed from an oxide, ceramic, polymer, organic compound, inorganic crystal, polycrystalline material, metal, semi-metal, radioactive material, solid, fluid, gel, suspension, and the like. Suitable semiconductor materials may include one or more of gallium nitride, aluminum nitride, silicon carbide, silicon, silicon-germanium, gallium arsenide, indium nitride, or boron nitride. In one embodiment, a semiconductor may be a crystalline structure that includes one or more of gallium, indium, germanium, arsenic, silicon, nitrogen, carbon, boron, and the like. For example, the semiconductor may include gallium nitride, gallium indium aluminum nitride, gallium indium germanium arsenide, and the like. A semiconductor layer may be formed from a single crystal, quasi-single crystal, or a polycrystalline material.

A single crystal includes material where the atoms form a periodic array. A quasi-single crystal may have a predetermined range of crystal defects, for example, from about 1000 defects to about $10^{12}$ defects per $cm^2$. Polycrystalline material includes a plurality of randomly oriented grains where each grain may include a single crystal.

As used herein, crystal defects may include one or more microcracks or voids, point defects, linear defects, planar defects, or matrix (3-D) defects unless context or language indicates that the subject is a particular subset of defect. Defects also may include cleavage points, grain boundaries, and the like.

Point defects may include one or more of vacancies, interstitials, or impurities. Some point defects may be built-in with the original crystal growth or may be formed in response to thermal energy, radiation, or electrical current.

Line defects may be a defect line created by translation of one part of a crystal with respect to another part of the crystal. A linear dislocation may include one or both of edge dislocation and screw dislocation.

In polycrystalline materials, grains of different orientations may exist. When two grains of different orientation meet, the region in-between the grains, or interface, may be called a grain boundary. Grain boundaries may be interface defects. Depending on the misorientation between the adjoining grains, different type of grain boundaries may be formed. A tilt boundary may have an axis of rotation parallel to the plane of the grain. A twist boundary may have an axis of rotation perpendicular to the plane of the grain boundary. At the grain boundary the lattice may be disrupted and a strain field may result. Phase boundary dislocations may include stacking faults. Stacking faults may occur when there is a change in the order of crystal planes. An example of this may be in a face centered cubic crystal with the normal plane sequence of ABCABC. A stacking fault may create a plane sequence of ABCABABC.

The number of phase boundary dislocations per area may affect the etch rate and the method or type of etching of a substrate. Phase boundary dislocations may include, for example, crystal defects and the like. Decreased numbers of crystal defects per area may decrease the surface area for contact of etching materials. Crystal defects may affect crystal properties, such as structural properties, electronic properties, chemical properties, thermodynamic properties, and scattering properties.

An etchant may attack a substrate at a grain boundary interface, at a surface, or both. Generally, an etch rate at a surface may be reduced relative to an etch rate of at a grain boundary interface due to the increase strain at the boundary interface. Thus, a substrate with no or reduce numbers of grain boundaries per unit area may etch differently than, for example, a polycrystalline material or sintered powder material. In one embodiment, the etchant may removed material from the substrate surface and at a grain boundary interface, in distinction to a conventional etchant that may only show appreciable material removal at the grain boundary interface. Accordingly, such an embodiment may be used to etch a substrate have few or no crystal defects, such as would be found in a single crystal substrate and/or a quasi-single crystal substrate.

Epitaxial growth of a semiconductor layer on a substrate may accomplished by, for example, VPE (Vapor Phase Epitaxy), HVPE (Halide Vapor Phase Epitaxy), MOVPE (Metallorganic Vapor Phase Epitaxy), MBE (Molecular Beam Epitaxy), GS-MBE (Gas Source MBE); CBE (Chemical Beam Epitaxy), MOC (Metallorganic Chloride), MOCVD (Metallorganic Chemical Vapor Deposition), or by sublimation. The MOC method may form a semiconductor film on a substrate by reacting a metallorganic compound (e.g., trimethyl gallium) with halogen-based gas (e.g., HCl) in a hot-wall type furnace. The product may include a metal halide (e.g., gallium chloride (GaCl)). The metal halide may be reacted with a pnictogen or chalcogen gas (e.g., ammonia ($NH_3$)), the product of which may be contacted to the substrate. MOCVD may provide a metallorganic compound (e.g., trimethyl gallium) with hydrogen gas and a pnictogen or chalcogen gas (e.g., ammonia ($NH_3$)) to a heated substrate in a cold-wall type furnace. This may induce the reaction of the metallorganic compound with the pnictogen or chalcogen gas to form a crystal layer on the substrate. HVPE may employ a pure metal (e.g., Ga) to eliminate carbon during crystal growth. This method may prepare the metal in a vessel in a hot wall type furnace. Halogen gas is passed over molten metal in the vessel to form a metal halide volatile species. A carrier gas may convey the volatilized species to a heated substrate where the volatilized species may be impinged with the pnictogen or chalcogen gas. The resulting crystal layer (e.g., GaN) may form on the heated substrate as a crystal film.

Etching conditions may be controlled to affect the processing environment. Suitable control variables may include temperature, pressure, concentration, material types and properties, contact time, and the like. Temperature may be measured with reference to the etchant, the multi-layer laminate, the single crystal layer, a vessel containing the any of foregoing, or an environment containing the vessel. In one embodiment, the temperature may be increased to be greater than about 200 degrees Celsius, in a range of from about 200 degrees Celsius to about 300 degrees Celsius, from about 300 degrees Celsius to about 400 degrees Celsius, from about 400 degrees Celsius to about 500 degrees Celsius, or greater than about 600 degrees Celsius. In one embodiment, temperature may be increased to be greater than about 600 degrees Celsius, in a range of from about 600 degrees Celsius to about 700 degrees Celsius, from about 700 degrees Celsius to about 800 degrees Celsius, from about 800 degrees Celsius to about 900 degrees Celsius, from about 900 degrees Celsius to about 1000 degrees Celsius, from about 1000 degrees Celsius to about 1100 degrees Celsius, or greater than about 1100 degrees Celsius. In one embodiment, the substrate may be removed at a temperature where the interface of the substrate and the remaining layer(s) of the laminate are essentially unstressed. Stress reduction may be accomplished by removing the laminate from the molten flux before cooling. This may reduce stress by avoiding solidification of the flux. By reducing the stress at the interface, a tendency for the laminate to crack may be reduced.

Pressure during etching may be measured directly or indirectly. Suitable pressures may be negative, about room pressure (1 atmosphere), or greater than room pressure. In one embodiment, pressure may be controlled by pumping a blanket gas into a reaction chamber in which etching may be performed. The blanket gas may be over-pressurized or under-pressurized to increase or decrease the pressure in the reaction chamber.

With reference to an etchant concentration, an effective amount may be in a range of greater than about one weight percent of total weight of a molten salt solution. In one embodiment, the concentration of the etchant in the molten salt solution may be in a range of from about 1 weight percent to about 10 weight percent, from about 10 weight percent to about 20 weight percent, from about 20 weight percent to about 30 weight percent, from about 30 weight percent to about 40 weight percent, from about 40 weight percent to about 50 weight percent, from about 50 weight percent to about 60 weight percent, from about 60 weight percent to about 70 weight percent, from about 70 weight percent to about 80 weight percent, from about 80 weight percent to about 90 weight percent, or from about 90 weight percent to about 100 weight percent based on the total weight. The balance of material may be, in one embodiment, an additive as disclosed herein.

A suitable etching time may be, e.g., less than about 0.5 hours, in a range of from about 0.5 hours to about 1 hour, from about 1 hour to about 5 hours, from about 5 hours to about 10 hours, or greater than about 10 hours.

In one embodiment, the laminate may communicate through a lead secured to the laminate. The lead may enable communication with the laminate via electrical or optical energy. Where the lead is an optical fiber, the laminate may form a light pipe. The light pipe may be in a wave-guide format, and may have one or more fiber optic interface with a respective lead. The interface may be disposed at a peripheral, outermost, or bottom layer of a multi-layer laminate, or may be disposed on an intermediate or sandwiched layer. Alternatively, an optically active polymer layer may be disposed on the laminate. The polymer layer may be bonded to the laminate to define an optical path. The interface may directly connect optical devices to the laminate, or the laminate may communicate with one or more optical devices through an optical fiber.

Suitable optical fibers may be obtained commercially. The laminate and/or polymer layer may be laser milled or ion milled inward from a planar surface, or from a sidewall. The fibers may interface with the optically active layer in a self-aligning format. The polymer layer, for example, may use an optical index matching coupling media. Deep precision insertion of a fiber optic directly to a layer on the laminate or die may be accomplished. Such direct connection may enable high-speed serial communication between processors and memory or other processors, and may reduce a high pin count die, which a high-speed serial fiber may otherwise require.

Active areas of an exposed surface laminate may be programmed so that a photo diode, or an array of photo diodes, may be turned on and/or sensed by clock cycles as needed, particularly for addressing or memory storage. Radiation of one or more wavelength, or multi colored light, may be used with appropriate filters within a layer of the laminate, such as media, photo diodes and the like. The filters may enable use by separating the signals for optical signal decoding.

Optionally, an electrode or electrical lead may be secured to the laminate. Power and/or data signals may be communicated to the laminate through the lead. Where only a portion of the substrate is removed during etching, the remaining portion of the substrate may aid in, for example, electrode placement. The electrode placement aid may enable fabrication of a vertical device with a relatively simplified architecture and/or a reduced overall footprint, as compared to other lateral devices. Further, such vertical orientation may improve thermal transfer or heat sinking, and increase light extraction, e.g., in a light-emitting device.

In another embodiment, a mixed-oxide or other similar distributed Bragg reflector (DBR) may be disposed on a freestanding semiconductor layer made by a method in accordance with embodiments of the invention. Such a disposition may enable fabrication of a resonant cavity LED, or a vertical cavity surface emitting laser with a high-efficiency mirror fabricated from high-refractive-index contrast material.

The etched laminate may be used to form one or more of metal insulator field effect transistor (MISFET), bipolar junction transistor (BJT), metal semiconductor field effect transistor (MESFET), metal oxide field effect transistor (MOSFET), a p-n junction field effect transistor (JFET), a Schottky rectifier or Schottky Barrier, a heterojunction bipolar transistor (HBT), a high electron mobility transistor (HEMT), also known as heterojunction field-effect transistor (HFET), modulation-doped field effect transistor (MODFET), two-dimensional electron gas field effect transistor (TEGFET), a selectively-doped heterostructure transistor (SDHT), a photodetector, an avalanche photodiode, a diode, a metal-semiconductor-metal diode, a power insulated gate bipolar transistor (IGBT), a cascode switch, an inner sub-band emitter, a quantum well infrared photodetector, a quantum dot infrared photodetector, or other optoelectronic and electronic device. In one embodiment, the etched laminate may be used as a power switch.

A laminate according to an embodiment of the invention that includes one or more Group III-nitride layers (e.g., GaN, AlN, InN, and/or TlN) may be useful in optoelectronic and electronic semiconductor devices. Suitable electronic devices may include a microwave power amplifier; a low-noise amplifier; or a power electronic application, including a transistor, rectifier, thyristor, p-i-n diode, power vertical MOSFET, heterojunction bipolar transistor or power vertical junction field effect transistor (JFET), and cascade switch. Other suitable applications may include light emitting diodes, laser diodes, and the like. For example, a semiconductor laser may be formed using a Group III-nitride single crystal substrate having a single crystal epitaxial layer grown on it. Such a semiconductor laser may be useful in next-generation CD and DVD readers and writers. These readers and writers may be amenable to violet laser light and GaN may provide violet laser light. The relatively smaller wavelength of violet light may increase data density in complimentary media.

During use of the etchant and preparation of an etched or freestanding laminate according to embodiments of the invention, a heat source, temperature sensor, and control unit may be used to control a temperature of one or more of an etchant, a multi-layer laminate, a single crystal, a vessel containing one of the aforementioned, or an environment in which any of the foregoing are disposed.

Optionally, a sublimation/decomposition inhibiting material may be introduced into an environment containing an etchant and multi-layer laminate. By blanketing the etchant and the multi-layer laminate with the sublimation/decomposition inhibiting material, for example in gaseous form, prior to or concurrent with an etching process, sublimation or decomposition of a predetermined layer of the multi-layer laminate may be reduced or eliminated. For example, gaseous ammonia ($NH_3$) may be used to blanket a multi-layer laminate that includes a sapphire support substrate and a gallium nitride (GaN) layer. At a temperature of greater than about 1000 degrees Celsius the gallium nitride layer may otherwise decompose to $Ga+N_2$; the presence of the ammonia gas blanket may reduce or eliminate the decomposition of the gallium nitride layer, while allowing the etchant to remove at least a portion of the sapphire layer.

An etching rate of the oxide layer may be controlled by affecting or selecting one or more process parameters (e.g., temperature, pressure, time, reaction order, and the like), by selecting predetermined materials, or by other methods. In one embodiment, the etching rate may be controlled by pre-selecting pressure and/or temperature in a defined volume in which the process may occur. Increasing temperature and/or lowering pressure may increase the etching rate or aggressiveness of the etchant relative to a target substrate. The etching rate may be decreased by adding a reaction inhibiting material or a non-reactive diluent to the etchant prior to, or concurrent with, the etching operation. Additionally, lowering temperature, increasing pressure and decreasing contact time may be suitable methods of decreasing an etching rate. In one embodiment, decreasing the etching rate may allow for more accurate control of a depth of etching. The etchant may be agitated during operation to increase the etching rate relative to what the etching rate might be without such agitation. Suitable agitation may be obtained by, for example, sonic stirring.

In one embodiment, a substrate may be removed from a semiconductor layer, and the resulting freestanding semiconductor layer may undergo additional processing. For example, an additional layer, such as a nucleation or low-temperature buffer layer, may be formed onto a freestanding semiconductor layer. The additional layer may be further processed to form a base for an epitaxial layer. Optionally, the additional layer may be removed subsequently to affect or improve the crystallinity of resulting laminate. In another embodiment, an electrical contact is deposited onto the freestanding semiconductor layer. Optionally, a heavily-doped contact layer is interposed between the free-standing semiconductor layer and the electrical contact.

The rate of etching may be or entirely independent of the crystal orientation of the substance to be etched, and therefore the etchant may remove material at about the same rate in all directions. The etchant may function as an isotropic etchant to form an etched channel, pit or groove in a single crystal layer, having a sidewall arc or curvature of less than 15 degrees, in a range of from about 15 degrees to about 45 degrees, or greater than about 45 degrees. Curvature is the ratio of the change in the angle of a tangent that moves over a given arc to the length of the arc. Optionally, a series of shallow etches with an interspersed masking process may be performed. This technique may form very high aspect ratio structures. A characteristic of this process may include vertical sidewalls having a scalloped appearance.

The laminate may be a single crystal or a quasi-single crystal grown directly onto the substrate without an intervening layer, which instance removal of the substrate may expose a surface of the single crystal or the quasi-single crystal. Particularly, removing the oxide layer may resulting in a newly exposed surface of a second layer having a microstructured surface profile on the subsequently exposed surface of the second layer. The resulting surface roughness may be expressed as a root mean square (RMS) surface roughness of less than about 0.1 micrometer in a 10 square micrometer area, in a range of from about 0.1 micrometer in a 10 square micrometer area to about 1 micrometer in a 10 square micrometer area, or greater than about 1 micrometer in a 10 square micrometer area. The surface texture of the etched regions may vary from rough to smooth depending on etching conditions.

In one embodiment, the semiconductor layer surface exposed by etching may have a plurality of pendant fluoro groups chemically bonded thereto. The exposed surface may be free of elemental aluminum or elemental aluminum with a protective oxide outer layer. The exposed surface may be free of elemental gallium. But, the exposed surface may have potassium ions, sodium ions, or both diffused down to a depth of about 5 micrometers.

The laminate substrate, e.g. single crystal aluminum oxide, may be partially removed isotropically by the etchant. The isotropic removal may yield rounded etch profiles of sidewalls of the remaining substrate. The curvature of these rounded profiles may be in a range of from about 15 degrees to about 45 degrees.

For a multi-layer laminate, removal of the supporting layer may form a freestanding laminate or an etched multi-layer laminate. Because of the relatively low temperatures used, the reduced amount of mechanical stress relative to some other methods, both the low temperature and the reduced stress, and the like, the freestanding laminate may be a thin freestanding film of a single crystal, a single material, or a plurality of layers of differing. In one embodiment, a thin freestanding film may have a thickness of less than about 100 micrometers, in a range of from about 100 to about 80 micrometers, from about 80 to about 70 micrometers, from about 70 micrometers to about 60 micrometers, from about 60 micrometers to about 50 micrometers, from about 50 micrometers to about 25 micrometers, from about 25 micrometers to about 15 micrometers, or less than about 15 micrometers.

Because of the selective nature of the etchant, the reduced mechanical stress, the availability of large and pure oxide substrates, the ease of removal of the substrate, and the relatively low temperatures that may be used may enable the production of a thick freestanding film. In one embodiment, a thick freestanding film may have a thickness of 100 micrometers or greater, or in a range of from about 100 micrometers to about 300 micrometers, from about 300 micrometers to about 325 micrometers, from about 325 micrometers to about 350 micrometers, from about 350 micrometers to about 400 micrometers, or greater than about 400 micrometers.

In one embodiment, a laminate formed by the method may be a quasi-single crystal, and may have a dislocation density of less than about $10^5$ per $cm^2$, in a range of from about $10^5$ per $cm^2$ to about $10^3$ per $cm^2$, or less than about $10^3$ per $cm^2$. In one embodiment, a laminate formed by the method may have an oxygen impurity concentration of less than $3\times10^{18}$ $cm^{-3}$, in a range of from about $3\times10^{18}$ $cm^{-3}$ to about $3\times10^{17}$ $cm^{-3}$, or less than about $3\times10^{17}$ $cm^{-3}$. A suitable method for forming a single crystal or a quasi-single crystal semiconductor layer is disclosed in co-pending U.S. patent application Ser. No. 10/329,982, which is hereby incorporated by reference to the extent that it discloses such methods, and associated electronic devices.

In one embodiment, the multi-layer laminate may allow a light sensitive portion of a die or diode to detect light injected into at least one layer via a fiber optic device to form a light pipe. Transmission of light through the light pipe may be possible whether the light injection is from a perpendicular or side edge of, for example, a sapphire layer portion of a semiconductor on insulator (SOI); or, whether the light injection is from a down-looking light transmission devices, such as a laser diode, light emitting diode (LED), multi-colored LED, or the like. Such a light-detecting arrangement may allow for a high speed serial path from one die to another, from a die to a backplane, from a die to a printed circuit board (PCB), and the like.

Figure 2:
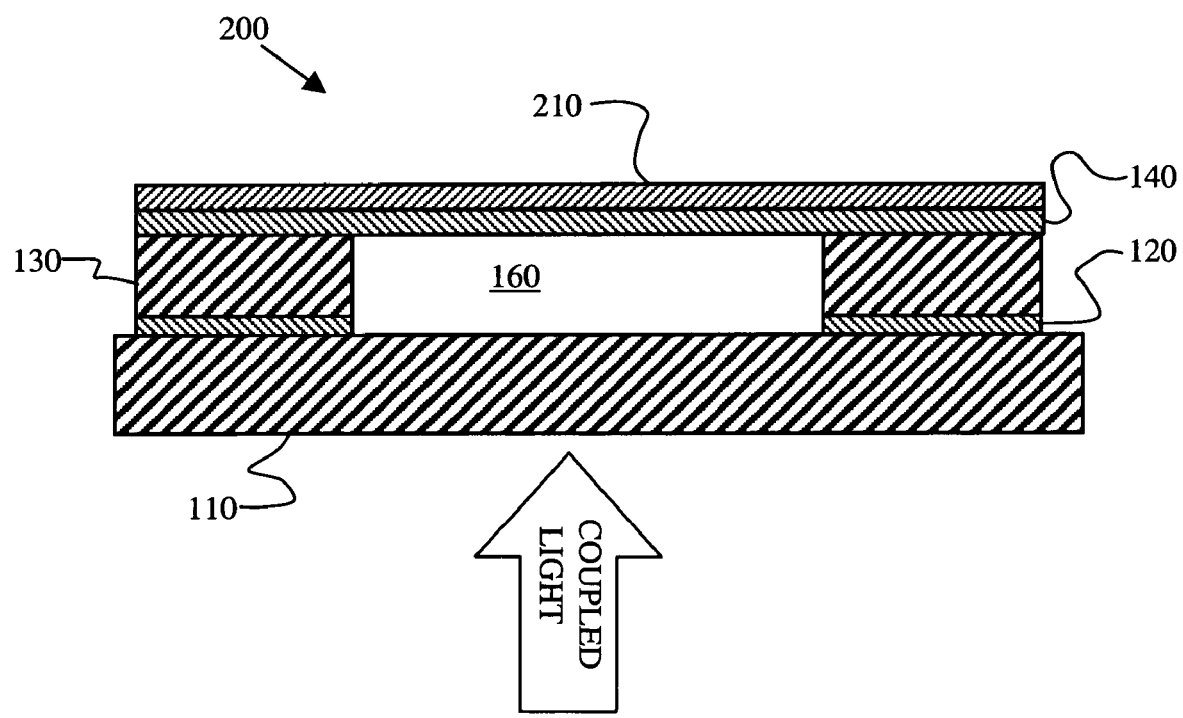
FIG. 2 is a cross-sectional side view of another pressure sensor comprising an embodiment of the invention

With reference to FIGS. 1 and 2, an electrical and an optical pressure sensor device are shown, respectively. The same reference numbers are used in both FIGS. 1 and 2 to indicate like parts. A pressure sensor 100 may include a mount substrate 110 formed from, for example, aluminum nitride, quartz, or sapphire ceramic. A vacuum wafer bond layer 120 may be secured to a surface of the mount substrate 110. The bond layer 120 may be formed from titanium/aluminum. A partially etched sapphire substrate 130 may be secured to the mount substrate 110 by the bond layer 120. A semiconductor layer 140, such as gallium nitride, may be formed by epitaxial growth on the substrate 130 prior to assembly of the pressure sensor 100. A suitable thickness may be, for example, about 30 micrometers thick. An array of ohmic contacts 130 may be secured to the outward facing surface of the substrate 130. The substrate 130 may have been etched to formed a hollowed area, which, when coupled with the mount substrate 110, may define an enclosed volume 160. The electrical-based pressure sensor 100 may sense pressure changes and signal via piezoelectric and/or capacitive means in response to those pressure changes. The pressure sensor 100 may measure one or both of radial and tangential stress.

Optical pressure sensor 200, shown in FIG. 2, differs from the pressure sensor of FIG. 1 in that no ohmic contacts may be required, an optional metallic reflector layer 210 is shown, and bond layer 120 is shown in a different configuration.

Pressure sensors according to embodiments of the invention may be useful in temperature ranges of greater than about 200 degrees Celsius, greater than about 300 degrees Celsius, or in a range of from about 300 degrees Celsius to about 625 degrees Celsius. If a material such as GaN is used as the semiconductor layer, the use of a wide bandgap semiconductor having strong piezoelectric polarization coefficients, approaching 1 $C/m^2$, may be particularly useful as quartz may be a fraction of that polarization coefficient. In one embodiment, the pressure sensor may be one or more of radiation resistant, heat resistant, chemical resistant, and extreme pressure resistant.

Figure 3:
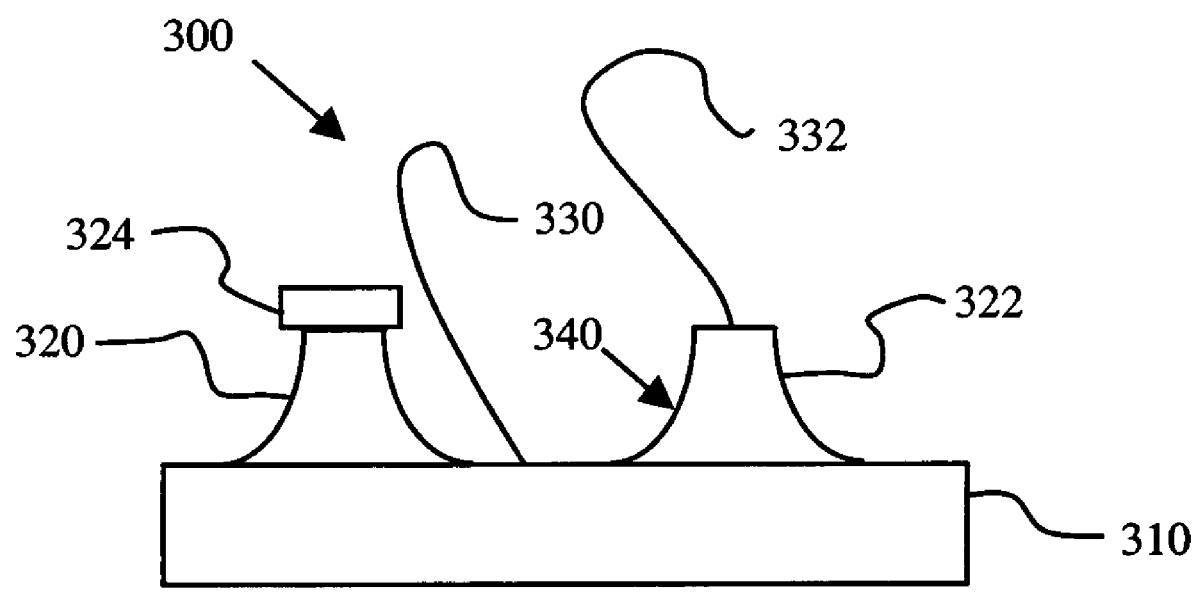
FIG. 3 is a schematic side view of a wave-guide comprising an embodiment of the invention.

A wave guide 300 is shown in FIG. 3. The wave guide 300 includes a first layer or substrate 310 and one or more second layers 320, 322 secured thereto. FIG. 3 shows a mask or protective layer 324 disposed on a protected or unexposed surface of the second layer 320. The second layers 320, 322 may cooperate with each other to define a region or area therebetween, which is an exposed surface 330 of the substrate 310. A protective layer has been removed from the protected or unexposed surface 332 of the second layer 322. The second layer 322 has a sidewall that is curved and perpendicular to the plane of the substrate surface 330. The radius of the curvature in the illustrated embodiment is about 45 degrees.

The substrate surface may be free of elemental gallium metal, free of elemental aluminum metal, or may be free of both. Particularly, the substrate surface may be free of the type of gallium and/or aluminum metal formed during a laser ablation process. Alternatively or additionally, the substrate surface may have a plurality of pendant fluoro groups chemically bonded thereto. A subsequent acid rinse, or the like, may remove the fluoro groups, if desired. Alternatively or additionally, one or more metal ions, such as potassium ions or sodium ions, may be diffused into the substrate surface to a depth of less than about 5 micrometers.

EXAMPLES

The following examples are intended only to illustrate methods and embodiments in accordance with the invention, and as such should not be construed as imposing limitations upon the claims. Unless specified otherwise, all ingredients are commercially available from such common chemical suppliers as Alpha Aesar, Inc. (Ward Hill, Mass.), Spectrum Chemical Mfg. Corp. (Gardena, Calif.), and the like.

Example 1

Selective Removal of Aluminum Oxide (Sapphire) Substrate from Gallium Nitride Layer Sample 1 is prepared by obtaining a single crystal sapphire substrate and forming a gallium nitride epitaxial layer on the sapphire substrate using a Hydride Vapor Phase Epitaxy (HVPE) process. Sample 1 is a multi-layer laminate having a sapphire layer and a gallium nitride layer. The sapphire layer is about 300 micrometers thick, and the gallium nitride layer is about 300 micrometers thick. Each of the layers is less than 20 millimeters wide and the layers are coextensive with each other.

Sample 1 is placed in a graphite boat with an etchant. The etchant includes a mixture of salts. Particularly, the salt mixture includes sodium cryolite ($Na_3AlF_6$); lithium cryolite ($Li_3AlF_6$); potassium cryolite ($K_3AlF_6$); lithium, sodium, and potassium aluminum fluorides; alkali gallium fluorides; alkali halides (NaCl, KCl, NaF, KF, and LiF); and sodium hydroxide (NaOH).

The graphite boat, containing the etchant and Sample 1, is placed in a tube furnace, and a gaseous ammonia blanket is pumped into the tube furnace to blanket the boat, sample and etchant. The temperature in the furnace is ramped to 600 degrees Celsius at a predetermined ramp rate and step rate. Pressure is maintained at standard room pressure. The temperature and pressure at maintained at the elevated levels (about 600 degrees Celsius) for about 10 hours. There is no agitation or perturbation of the sample during the procedure.

During the procedure, the sapphire layer is removed preferentially or selectively relative to the gallium nitride layer. Sample 1 is removed from the melt at temperature or allowed to cool and washed with, e.g., aqua regia or mineral acid. In this example, the sample is cooled and washed with mineral acid. Observations of the washed sample with appropriate instrumentation indicate that the sapphire layer is entirely removed, thus leaving the gallium nitride layer as a freestanding layer. Examination of the gallium nitride layer surface formerly in contact with and covered by the sapphire layer indicates a macroscopic surface profile, with pits and grooves having a height or depth of more than about 1 micrometer.

The procedure in Example 1 is repeated with agitation. The time is decreased to accommodate an increase in the etching rate responsive to the agitation. As before, examination of the gallium nitride layer surface formerly in contact with and covered by the sapphire layer indicates a macroscopic surface profile, with pits and grooves having a height or depth of more than about 1 micrometer.

Example 2

Selective Removal of Aluminum Oxide (Sapphire) Substrate from Gallium Nitride Layer Sample 2 is a multi-layer laminate prepared in the same manner as Sample 1, described above.

Sample 2 is placed in a graphite boat with an etchant. The etchant includes a mixture of salts. Particularly, the salt mixture includes an alcohol solution of fluosilicic acid ($H_2SiF_6$), sodium fluosilicic acid ($Na_2SiF_6$), sodium hydroxide (NaOH), tetramethyl ammonium hydroxide, and alkali hydroxides. The temperature in the furnace is ramped to 200 degrees Celsius at a predetermined ramp rate and step rate. Pressure is maintained at standard room pressure. The temperature and pressure at maintained at the elevated levels (about 200 degrees Celsius) for about 10 hours. There is no agitation or perturbation of the sample during the procedure.

Observations of the washed sample with appropriate instrumentation indicate that the sapphire layer is entirely removed, thus leaving the gallium nitride layer as a freestanding layer.

Example 3

Selective Removal of Aluminum Oxide (Sapphire) Substrate from Gallium Nitride Layer Sample 3 is a multi-layer laminate prepared in the same manner as Sample 1, described above.

Sample 3 is placed in a graphite boat with an etchant. The etchant includes a mixture of salts. Particularly, the salt mixture includes potassium tetrafluoro borate ($KBF_4$). The temperature in the furnace is ramped to 600 degrees Celsius at a predetermined ramp rate and step rate. Pressure is maintained at standard room pressure. The temperature and pressure at maintained at the elevated levels (about 600 degrees Celsius) for about 10 hours. There is no agitation or perturbation of the sample during the procedure. The sample is removed from the molten salt solution prior to or during the cooling.

Observations of the recovered sample with appropriate instrumentation indicate that the sapphire layer is entirely removed, thus leaving the gallium nitride layer as a freestanding layer.

Examples 4 through 10

Selective Removal of Aluminum Oxide Substrate from Semiconductor Layer

Example 4 is the same as Example 1, except that only sodium cryolite is used as the etchant. The aluminum oxide substrate is entirely removed.

Example 5 is the same as Example 1, except that only sodium cryolite is used as the etchant and a platinum mask is placed over a portion of the sapphire prior to and during the etching step. The mask defines exposed areas of the surface of the sapphire layer and protected areas of the surface of the sapphire layer. The aluminum oxide substrate is removed from the exposed surface areas, but not from the protected surface areas. A pattern is formed in the sapphire that compliments the design of the platinum mask.

Example 5 is repeated using masks of differing patterns. The masks form corresponding patterns of aluminum oxide/aluminum oxide-free areas, including grids useful for grid formation for die separation, die shaping for controlled light extraction, and a drumhead die and other shaped dies.

Example 6 is the same as Example 5, except that the mask is platinum over a titanium/tungsten alloy. The resulting multi-layer laminate has a gallium nitride layer with a patterned sapphire layer overlaying a surface thereof.

Example 7 is the same as Example 1, except that the substrate layer is emerald rather than sapphire. The emerald layer is selectively removed from the gallium nitride layer at an etching rate that is about the same as sapphire.

Example 8 is the same as Example 7, except that ruby is used rather than emerald in the substrate layer. The result is the same, the ruby layer is selectively removed from the gallium nitride layer at an etching rate that is about the same as sapphire.

Example 9 is the same as Example 1, except that gallium arsenide, aluminum nitride, silicon nitride, silicon carbide, silicon, silicon germanium, indium nitride, indium aluminum gallium nitrogen, and boron nitride, and other group III nitrides are substituted for the gallium nitride substrate in various separate trials, each having an initial aluminum oxide layer. In each instance, the aluminum oxide layer is removed by the etching process.

Example 10

Selective Removal of Aluminum Oxide from Gallium Nitride Layer

Sample 10 is a 1 square centimeter piece of HVPE produced gallium nitride (GaN) on aluminum oxide (sapphire). Sample 10 has a total thickness of 700 micrometers. 200 micrometers of the total thickness are attributable to the GaN layer, with the remaining 300 micrometers attributable to the sapphire layer.

Sample 10 is placed in a graphite crucible with 2.0010 grams of sodium cryolite. The crucible is placed in a quartz tube furnace lined with GRAFOIL brand flexible graphite, which is commercially available from GrafTech International Ltd. (Wilmington, Del.). The temperature in the furnace is increased at a rate of 250 degrees Celsius per hour until a furnace temperature of 1050 degrees Celsius is achieved. One the furnace temperature is equilibrated at 1050 degrees Celsius; the furnace temperature (and the crucible holding Sample 10 inside the furnace) is maintained at 1050 degrees Celsius for 2 hours. The temperature in the furnace is decreased at a rate of 250 degrees Celsius per hour until room temperature is achieved.

Sample 10 is recovered from the crucible. Upon recovery, Sample 10 is cleaned using aqua regia dissolution. Visual observation reveals that the GaN surface is untouched while the sapphire layer is completely removed. Measurement of the recovered sample indicates that the GaN thickness does not change and is 200 micrometers thick, while 300 micrometers of the sapphire layer are removed.

Example 11

Removal of Aluminum Oxide Layer from Thin Film Semiconductor Layer

A plurality of samples is prepared by forming thin film epitaxy layers (less than about 50 micrometers) on an aluminum oxide single crystal substrate. Sample 11A has an average thickness of 0.1 micrometers, Sample 11B has an average thickness of 1 micrometer, Sample 11C has an average thickness of 10 micrometers, Sample 11D has an average thickness of 20 micrometers, and Sample 11E has an average thickness of 50 micrometers.

The Samples 11A-11E are processed according to the procedure outlined in Example 3. In each instance for Samples 11A-11E, the aluminum oxide layer is removed by the etching process. The gallium nitride layer is left as a freestanding layer.

Example 12

Removal of Aluminum Oxide Layer from Thick Film Semiconductor Layer

Example 12 is the same as Example 11, except that the samples are formed having a total thick of 700 micrometers, 300 micrometers of the total thickness being attributable to an aluminum oxide substrate, and the remaining 400 micrometers being attributable to a gallium nitride single crystal or quasi-single crystal layer. After processing, the gallium nitride layer is left as a freestanding laminate having an average thickness in a range of greater than 300 micrometers, and particularly an average thickness in range of about 400 micrometers.

Example 13

Removal of Aluminum Oxide Layer from Thin Film Semiconductor Layer

Example 13 is the same as Example 11, except that the samples are formed from aluminum indium gallium nitride (AlInGaN), rather than gallium nitride. After processing, the aluminum indium gallium nitride layer is left as a freestanding layer.

The embodiments described herein are examples of compositions, structures, systems and methods having elements corresponding to the elements of the invention recited in the claims. This written description may enable one of ordinary skill in the art to make and use embodiments having alternative elements that likewise correspond to the elements of the invention recited in the claims. The scope thus includes compositions, structures, systems and methods that do not differ from the literal language of the claims, and further includes other compositions, structures, systems and methods with insubstantial differences from the literal language of the claims. While only certain features and embodiments have been illustrated and described herein, many modifications and changes may occur to one of ordinary skill in the relevant art. The appended claims are intended to cover all such modifications and changes.

The invention claimed is:

1. A method of wet etching, comprising:
contacting an etchant to at least one surface of a substrate of a multi-layer laminate, wherein the etchant comprises a halogenated salt and the substrate comprises single crystal aluminum oxide or quasi-single crystal aluminum oxide, or
contacting an etchant to at least one surface of a substrate of a multi-layer laminate, wherein the etchant comprises Cryolite ($Na_3AlF_6$), potassium tetrafluoro borate ($KBF_4$), or both;
blanketing the etchant and the multi-layer laminate with a sublimation inhibiting material, a decomposition inhibiting material, or both, prior to or concurrent with the contacting; and
etching at least a portion of the substrate.

2. The method as defined in claim 1, wherein the step of etching comprises forming an etched channel, pit or groove having a sidewall in the substrate, the channel, pit or groove having a curvature in a range of from about 15 degrees to about 45 degrees, or the channel, pit or groove having a scalloped profile.

3. The method as defined in claim 1, wherein the etchant comprises one or both of Cryolite ($Na_3AlF_6$) and potassium tetrafluoro borate ($KBF_4$).

4. The method as defined in claim 1, wherein the step of etching at least a portion of the substrate comprises selectively etching the substrate portion at an etching rate that is greater than about an etching rate of at least one other layer of the multi-layer laminate.

5. The method as defined in claim 4, wherein the etchant comprises a dopant or dopant precursor operable to diffuse into one or more layers of the multi-layer laminate during the contacting.

6. The method as defined in claim 1, further comprising increasing a temperature of the etchant, the multi-layer laminate, or both to be greater than about 600 degrees Celsius.

7. The method as defined in claim 6, further comprising controlling a temperature of the etchant, the multi-layer laminate, or both to be less than about 1100 degrees Celsius.

8. The method as defined in claim 1, wherein the substrate comprises one or more single crystal or quasi-single crystal of sapphire, emerald, or ruby.

9. The method as defined in claim 1, wherein the step of etching comprises removing the entire substrate to form a freestanding laminate.

10. The method as defined in claim 1, further comprising controlling a rate of the etching of the substrate by the etchant.

11. The method as defined in claim 10, wherein controlling the rate of etching comprises one or more of:
controlling pressure in a volume comprising the etchant and the substrate; controlling a temperature of the etchant and the multi-layer laminate to be in a range of temperatures greater than a minimum etching initiation temperature;
agitating the etchant;
positioning the multi-layer laminate in a predetermined orientation relative to the etchant; and
adding a reaction inhibiting material to the etchant prior to or concurrent with contact to the substrate.

12. The method as defined in claim 11, further comprising controlling a depth of etching by further controlling an amount of contact time of the etchant and the substrate, the quantity of etchant in contact with the substrate, or both.

13. The method as defined in claim 1, further comprising masking at least a portion of the substrate with a protective mask layer to define one or more protected surface area and one or more exposed surface area of the substrate.

14. The method as defined in claim 13, further comprising removing at least a portion of the substrate at the one or more exposed surface areas.

15. The method as defined in claim 1, wherein the multi-layer laminate further comprises a semiconductor layer secured directly to the substrate, or spaced from the substrate by one or more intervening layers.

16. The method ass defined in claim 15, wherein the semiconductor layer comprises one or more Group III metal nitride.

17. The method as defined in claim 15, wherein the semiconductor layer comprises gallium nitride.

18. The method as defined in claim 15, wherein the semiconductor layer has a surface initially in contact with the substrate that is at least partially exposed by the etching of the substrate, and the method further comprises forming a microstructured surface profile on the exposed surface of the semiconductor layer.

19. The method as defined in claim 15, wherein the semiconductor layer has a dislocation density of less than about 1,000,000 per square centimeter.

20. A method of wet etching, comprising:
contacting an etchant to at least one surface of a substrate of a multi-layer laminate, wherein the etchant comprises a halogenated salt and a dopant or dopant precursor operable to diffuse into one or more layers of the multi-layer laminate during contacting, and the substrate comprises single crystal aluminum oxide or quasi-single crystal aluminum oxide, or
contacting an etchant to at least one surface of a substrate of a multi-layer laminate, wherein the etchant comprises Cryolite ($Na_3AlF_6$), potassium tetrafluoro borate ($KBF_4$), or both, and further comprises a dopant or dopant precursor operable to diffuse into one or more layers of the multi-layer laminate during contacting; and selectively etching at least a portion of the substrate at an etching rate that is greater than about an etching rate of at least one other layer of the multi-layer laminate.

21. The method as defined in claim 20, wherein the step of etching comprises forming an etched channel, pit or groove having a sidewall in the substrate, the channel, pit or groove having a curvature in a range of from about 15 degrees to about 45 degrees, or the channel, pit or groove having a scalloped profile.

22. The method as defined in claim 20, wherein the etchant comprises one or both of Cryolite ($Na_3AlF_6$) and potassium tetrafluoro borate ($KBF_4$).

23. The method as defined in claim 20, further comprising increasing a temperature of the etchant, the multi-layer laminate, or both to be greater than about 600 degrees Celsius.

24. The method as defined in claim 23, further comprising controlling a temperature of the etchant, the multi-layer laminate, or both to be less than about 1100 degrees Celsius.

25. The method as defined in claim 20, wherein the substrate comprises one or more single crystal or quasi-single crystal of sapphire, emerald, or ruby.

26. The method as defined in claim 20, wherein the step of etching comprises removing the entire substrate to form a freestanding laminate.

27. The method as defined in claim 20, further comprising controlling a rate of the etching of the substrate by the etchant.

28. The method as defined in claim 27, wherein controlling the rate of etching comprises one or more of:

controlling pressure in a volume comprising the etchant and the substrate; controlling a temperature of the etchant and the multi-layer laminate to be in a range of temperatures greater than a minimum etching initiation temperature;

agitating the etchant;

positioning the multi-layer laminate in a predetermined orientation relative to the etchant; and adding a reaction inhibiting material to the etchant prior to or concurrent with contact to the substrate.

29. The method as defined in claim 28, further comprising controlling a depth of etching by further controlling an amount of contact time of the etchant and the substrate, the quantity of etchant in contact with the substrate, or both.

30. The method as defined in claim 20, further comprising masking at least a portion of the substrate with a protective mask layer to define one or more protected surface area and one or more exposed surface area of the substrate.

31. The method as defined in claim 30, further comprising removing at least a portion of the substrate at the one or more exposed surface areas.

32. The method as defined in claim 20, wherein the multi-layer laminate further comprises a semiconductor layer secured directly to the substrate, or spaced from the substrate by one or more intervening layers.

33. The method ass defined in claim 32, wherein the semiconductor layer comprises one or more Group III metal nitride.

34. The method as defined in claim 32, wherein the semiconductor layer comprises gallium nitride.

35. The method as defined in claim 32, wherein the semiconductor layer has a surface initially in contact with the substrate that is at least partially exposed by the etching of the substrate, and the method further comprises forming a microstructured surface profile on the exposed surface of the semiconductor layer.

36. The method as defined in claim 32, wherein the semiconductor layer has a dislocation density of less than about 1,000,000 per square centimeter.

* * * * *